(12) United States Patent
Sukegawa et al.

(10) Patent No.: US 11,232,904 B2
(45) Date of Patent: Jan. 25, 2022

(54) TAPING REEL, MANUFACTURING METHOD OF COIL COMPONENT, AND ELECTRONIC COMPONENT

(71) Applicant: Murata Manufacturing Co., Ltd., Kyoto-fu (JP)

(72) Inventors: Takashi Sukegawa, Nagaokakyo (JP); Masashi Miyamoto, Nagaokakyo (JP); Ryota Hashimoto, Nagaokakyo (JP); Kentaro Yamaguchi, Nagaokakyo (JP); Chihiro Yamaguchi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/922,947

(22) Filed: Jul. 7, 2020

(65) Prior Publication Data

US 2020/0335278 A1     Oct. 22, 2020

Related U.S. Application Data

(62) Division of application No. 16/421,513, filed on May 24, 2019, now Pat. No. 10,763,040.

(30) Foreign Application Priority Data

Jun. 11, 2018  (JP) .............................. JP2018-111311

(51) Int. Cl.
*H01F 17/04*     (2006.01)
*H01F 27/28*     (2006.01)
(Continued)

(52) U.S. Cl.
CPC ............. *H01F 41/07* (2016.01); *B65D 73/02* (2013.01); *B65D 85/672* (2013.01); *H01F 17/04* (2013.01);
(Continued)

(58) Field of Classification Search
CPC ......... H05K 1/181; H01F 17/04; H01F 27/28; H01F 27/29; H01F 41/07; H01F 41/069
(Continued)

(56) References Cited

U.S. PATENT DOCUMENTS 4,867,308 A * 9/1989 Crawford ............... B65D 73/02
                                                    206/714
4,898,275 A * 2/1990 Skrtic .................... B65D 73/02
                                                    206/526

(Continued)

FOREIGN PATENT DOCUMENTS

CN     108878097 A     11/2018
JP     S63-232170 A    9/1988
(Continued)

OTHER PUBLICATIONS

An Office Action; "Notice of Reasons for Refusal," mailed by the Japanese Patent Office dated Nov. 4, 2020, which corresponds to Japanese Patent Application No. 2018-111311 and is related to U.S. Appl. No. 16/922,947 with English language translation.
(Continued)

*Primary Examiner* — Xiaoliang Chen
(74) *Attorney, Agent, or Firm* — Studebaker & Brackett PC

(57) ABSTRACT

A taping reel with a plurality of coil components packed in the tape reel, comprising a tape including a plurality of pockets arranged along a longitudinal direction and each having one of the coil components stored therein, and a reel around which the tape is wound. The coil components each include a core including a winding core part, and a coil wound around the winding core part and including a plurality of wires. The coil includes a twisted wire portion in which the plurality of wires is twisted together. The plurality of coil components includes first coil components having the twisting direction of the twisted wire portion opposite to the
(Continued)

US 11,232,904 B2

Page 2 twisting direction of the twisted wire portion of other coil components.

4 Claims, 9 Drawing Sheets

(51) Int. Cl.
| | |
|---|---|
| *H01F 27/29* | (2006.01) |
| *H01F 41/07* | (2016.01) |
| *H01F 41/069* | (2016.01) |
| *H01F 27/02* | (2006.01) |
| *B65D 73/02* | (2006.01) |
| *B65D 85/672* | (2006.01) |
| *H05K 1/18* | (2006.01) |
| *H01F 17/00* | (2006.01) |

(52) U.S. Cl.
CPC ....... *H01F 27/027* (2013.01); *H01F 27/2823* (2013.01); *H05K 1/181* (2013.01); *H01F 2017/0093* (2013.01); *H05K 2201/1003* (2013.01)

(58) Field of Classification Search
USPC ......... 174/260; 206/713, 714; 428/343, 354; 140/118, 119
See application file for complete search history.

(56) References Cited

U.S. PATENT DOCUMENTS

| | | | | |
|---|---|---|---|---|
| 5,607,313 | A * | 3/1997 | Nyman | H01R 12/57 439/83 |
| 2003/0219330 | A1* | 11/2003 | Lyndaker | H05K 13/0419 414/411 |
| 2005/0163604 | A1* | 7/2005 | Truyens | H05K 13/021 414/737 |
| 2006/0059883 | A1* | 3/2006 | Hopkinson | H01B 13/0257 57/236 |
| 2008/0006922 | A1* | 1/2008 | Gutentag | H01L 21/67132 257/686 |
| 2009/0000688 | A1* | 1/2009 | Hopkinson | H01B 11/02 140/119 |
| 2009/0032430 | A1* | 2/2009 | Wihren | A61P 29/00 206/526 |
| 2009/0173660 | A1* | 7/2009 | Lee | H05K 13/0084 206/713 |
| 2010/0126620 | A1* | 5/2010 | Johnson | H01B 13/0207 140/118 |
| 2011/0233109 | A1* | 9/2011 | Ziganto | B65B 15/04 206/714 |
| 2014/0012130 | A1* | 1/2014 | Jacobsen | A61B 5/065 600/424 |
| 2014/0311945 | A1* | 10/2014 | Ziberna | H05K 13/0419 206/717 |
| 2015/0059171 | A1* | 3/2015 | Kanai | H05K 13/0417 29/832 |
| 2015/0158649 | A1* | 6/2015 | Huang | H05K 13/0084 206/714 |
| 2016/0205819 | A1* | 7/2016 | Jacobsson | B65G 1/1371 700/112 |
| 2016/0368639 | A1* | 12/2016 | Vissers | B65B 7/164 |
| 2017/0294264 | A1* | 10/2017 | Hashimoto | H01F 27/2823 |
| 2018/0166204 | A1* | 6/2018 | Kobayashi | H01F 17/045 |
| 2018/0330875 | A1* | 11/2018 | Yamaguchi | H01F 41/082 |
| 2018/0330876 | A1* | 11/2018 | Yamaguchi | H01F 41/082 |
| 2018/0330877 | A1* | 11/2018 | Yamaguchi | B65H 54/2896 |
| 2018/0330878 | A1* | 11/2018 | Yamaguchi | B65H 54/2896 |
| 2018/0330882 | A1* | 11/2018 | Yamaguchi | H01F 27/292 |
| 2019/0378646 | A1* | 12/2019 | Sukegawa | H01F 27/2823 |

FOREIGN PATENT DOCUMENTS

| | | |
|---|---|---|
| JP | 2010-147132 A | 7/2010 |
| JP | 2012-079995 A | 4/2012 |
| JP | 2014-031194 A | 2/2014 |
| JP | 2014-216525 A | 11/2014 |
| JP | 2017-011132 A | 1/2017 |

OTHER PUBLICATIONS

An Office Action; "Notice of Reasons for Refusal," mailed by the Japanese Patent Office on Jun. 22, 2021, which corresponds to Japanese Patent Application No. 2018-111311 and is related to U.S. Appl. No. 16/922,947 with English language translation.

* cited by examiner

TAPING REEL, MANUFACTURING METHOD OF COIL COMPONENT, AND ELECTRONIC COMPONENT

CROSS REFERENCE TO RELATED APPLICATION

This application is a Divisional of U.S. patent application Ser. No. 16/421,513 filed May 24, 2019, which claims benefit of priority to Japanese Patent Application 2018-111311, filed Jun. 11, 2018, the entire content of which is incorporated herein by reference.

BACKGROUND

Technical Field

The present disclosure relates to a taping reel, a manufacturing method of a coil component, and an electronic component.

Background Art

A conventional winding type coil component including a wire is described in Japanese Laid-Open Patent Publication No. 2014-216525. This coil component includes a core including a winding core part and a coil wound around the winding core part and including two wires, the coil has a twisted wire portion in which two wires are twisted together, and the twisted wire portion is directly wound around the winding core part of the core.

A method of winding such a twisted wire portion around the winding core part is described in Japanese Laid-Open Patent Publication No. 2017-11132. In this winding method, a plurality of wires is allowed to pass through a tensioner and a winding nozzle in this order, and the winding nozzle is revolved around the winding core part without being rotated around its own axis, so that while the twisted wire portion is formed, the twisted wire portion is wound around the winding core part.

SUMMARY

If the conventional coil component as described above is manufactured, a plurality of coil components are packed in a taping reel. Considering unified specifications of the coil components, it is preferable that the twisted wire portions of all the coil components in the taping reel have the same twisting direction. To achieve the same twisting directions of the twisted wire portions for all the coil components in the conventional winding method of the twisted wire portion, a winding nozzle may continuously be revolved around the winding core part always in a constant direction without being rotated around its own axis.

On the other hand, the present inventors found that, when the winding nozzle is revolved without rotating the winding nozzle around its own axis, a plurality of wires each rotates around its own axis between the tensioner and the winding nozzle and causes torsion in some cases. Therefore, if the revolution described above is continuously repeated always in a constant direction, superposition of torsion may result in a kink in each of the wires.

Therefore, the present disclosure provides a taping reel, a manufacturing method of a coil component, and an electronic component capable of reducing occurrence of kinks in wires.

Accordingly, a taping reel of an aspect or the present disclosure is a taping reel with a plurality of coil components packed therein, comprising a tape including a plurality of pockets arranged along a longitudinal direction and each having one of the coil components stored therein; and a reel around which the tape is wound. The coil components each include a core including a winding core part, and a coil wound around the winding core part and including a plurality of wires. The coil includes a twisted wire portion in which the plurality of wires is twisted together. Also, the plurality of coil components includes first coil components having the twisting direction of the twisted wire portion opposite to the twisting direction of the twisted wire portion of other coil components.

The taping reel of the present disclosure allows mixing the first coil components having the twisting direction of the twisted wire portion opposite to the other coil components and therefore eliminates the need for continuously revolving a winding nozzle always in a constant direction at the time of manufacturing of the coil component, so that the occurrence of kinks can be reduced in the wires.

In an embodiment of the taping reel, the winding direction of the coil around the winding core part of the first coil components is opposite to the winding direction of the coil around the winding core part of the other coil components. According to the embodiment, since the direction of revolving of the winding nozzle can easily be changed to the opposite direction at the time of manufacturing of the first coil components and the other coil components, the occurrence of kinks can easily be reduced in the wires.

In an embodiment of the taping reel, two or more of the pockets having the first coil components stored therein are arranged in succession. According to the embodiment, since storing the first coil components in succession in the tape is allowed, a step of rearranging the order of the coil components is not necessary before a step of storing the coil components into the tape, so that a manufacturing time per taping reel can be shortened.

In an embodiment of the taping reel, the taping reel includes a portion in which the number of the continuously arranged pockets having the first coil components stored therein is different from the number of the continuously arranged pockets having the other coil components stored therein. According to the embodiment, since this allows storing the first coil components and the other coil components irregularly in the plurality of the pockets, the step of rearranging the order of the coil components is not necessary before the step of storing the coil components into the tape, so that a manufacturing time per taping reel can be shortened.

In an embodiment of the taping reel, in the plurality of coil components, the number of twists per turn of the twisted wire portion is not an integer. According to the embodiment, a positional relationship between the wires is not fixed at each turn of the twisted wire portion, and this can reduce the line capacity of the twisted wire portion and the bias of capacity between a mounting substrate and the wires.

In an embodiment of the taping reel, the number of twists per turn of the twisted wire portion is n1/n2 (n2 is a prime number). According to the embodiment, an interval is made wider between turns having the same positional relationship between the wires at each turn of the twisted wire portion, and this can further reduce the line capacity of the twisted wire portion and the bias of capacity between the mounting substrate and the wires.

In an embodiment of the taping reel, in the plurality of coil components, the twisted wire portion includes one or more inverted portions in which the twisting direction is inverted. According to the embodiment, this reduces superposition of twisting in the twisted wire portion, so that the reliability of the wires is increased.

In an embodiment of the taping reel, the number of the inverted portions of the twisted wire portion is an even number. According to the embodiment, the twisting direction of the twisted wire portion wound around the winding core part becomes the same at the beginning and the end at the time of manufacturing of the coil component, so that torsion tends to remain in the wires for each manufacturing unit. Therefore, this makes more effective the effect of reducing the occurrence of kinks in the wires by allowing mixing the coil component having the opposite twisting direction of the twisted wire portion.

In an embodiment of the taping reel, the twisted wire portion includes a plurality of inverted portions and has a position where the adjacent inverted portions are arranged at equal intervals. According to the embodiment, this can reduce the line capacity of the twisted wire portion and the bias of capacity between the mounting substrate and the wires.

In an embodiment of a manufacturing method of a coil component comprises the steps of forming a first twisted wire portion by twisting a plurality of wires together in a first twisting direction; forming a second twisted wire portion by twisting the plurality of wires together in a second twisting direction opposite to the first twisting direction; winding at least the first twisted wire portion around a winding core part of a core to manufacture a first coil component; and winding at least the second twisted wire portion around a winding core part of a core to manufacture another coil component.

According to the embodiment, the manufacturing method allows mixing the first coil component having the twisting direction of the twisted wire portion opposite to the other coil component and therefore eliminates the need for continuously revolving the winding nozzle always in a constant direction at the time of manufacturing of the coil component, so that the occurrence of kinks can be reduced in the wires.

In an embodiment of the manufacturing method of a coil component, at the step of forming the first twisted wire portion, a winding nozzle holding the plurality of wires is revolved around the winding core part in a first direction without being rotated around its own axis. Also, at the step of forming the second twisted wire portion, the winding nozzle is revolved around the winding core part in a direction opposite to the first direction without being rotated around its own axis.

According to the embodiment, since the winding nozzle is revolved in the opposite directions at the step of forming the first twisted wire portion and the step of forming the second twisted wire portion, torsion hardly remains in the wires.

An embodiment of a manufacturing method of a taping reel, comprises the steps of manufacturing the first coil component and the other coil component with the manufacturing method of a coil component; preparing a tape including a plurality of pockets arranged along a longitudinal direction; storing the first coil component in one of the pockets; and storing the other coil component in one of the pockets. Also, the step of storing the first coil component and the step of storing the other coil component are irregularly performed.

According to the embodiment, since this allows storing the first coil components and the other coil components irregularly in the plurality of the pockets, the step of rearranging the order of the coil components is not necessary before the step of storing the coil components into the tape, so that a manufacturing time per taping reel can be shortened.

An embodiment of an electronic component comprises a mounting substrate; and a plurality of coil components mounted on the mounting substrate. The coil components each include a core including a winding core part, and a coil wound around the winding core part and including a plurality of wires. The coil includes a twisted wire portion in which the plurality of wires is twisted together, and the plurality of coil components includes first coil components having the twisting direction of the twisted wire portion opposite to the twisting direction of the twisted wire portion of other coil components.

According to the embodiment, this allows mixing the first coil components having the twisting direction of the twisted wire portion opposite to the other coil components and therefore eliminates the need for continuously revolving the winding nozzle always in a constant direction at the time of manufacturing of the coil component, so that the occurrence of kinks can be reduced in the wires.

According to the taping reel, the manufacturing method of a coil component and the electronic component of an aspect of the present disclosure, the occurrence of kinks in wires can be reduced.

DETAILED DESCRIPTION

Figure 1:
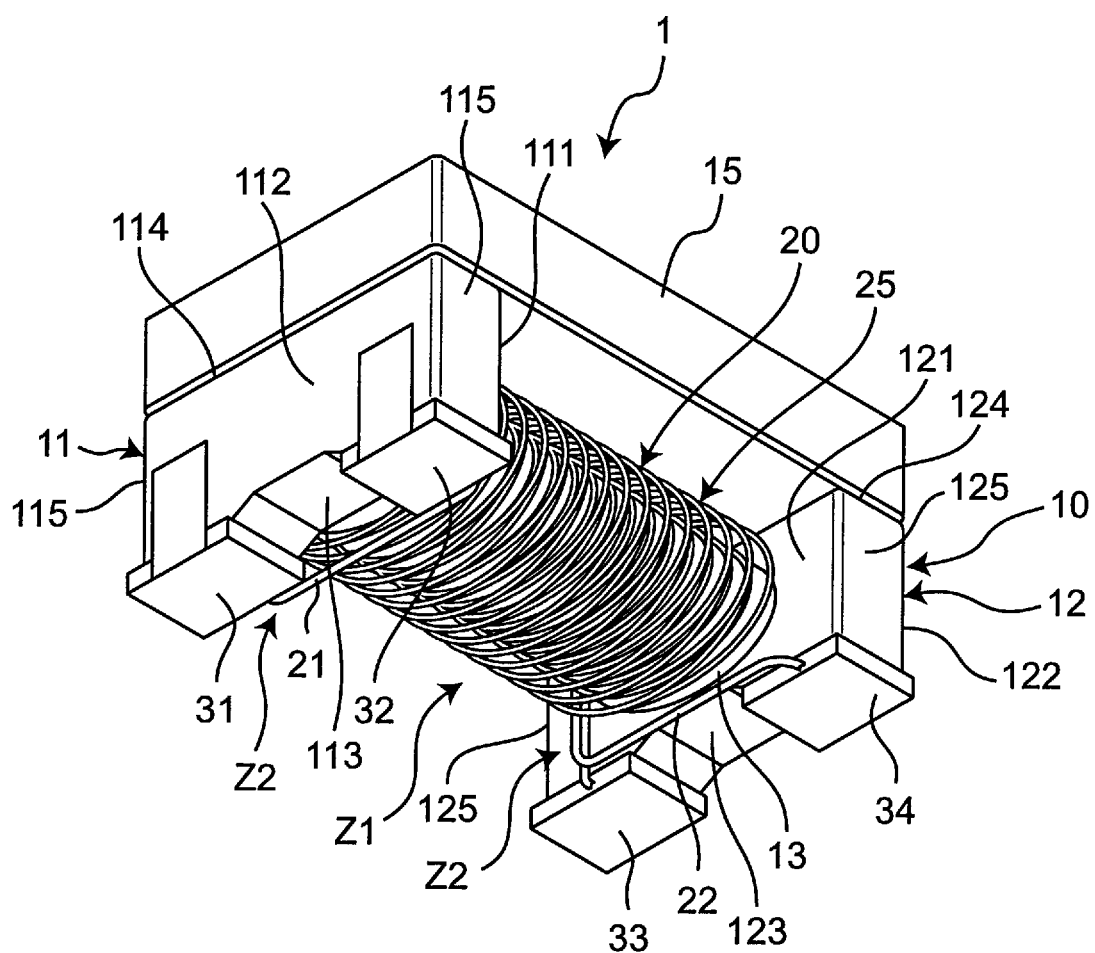
FIG. 1 is a perspective view showing a first embodiment of a coil component as viewed from a lower surface side.

An aspect of the present disclosure will now be described in detail with embodiments shown in the drawings.

First Embodiment

FIG. 1 is a perspective view showing a first embodiment of a coil component as viewed from a lower surface side. As shown in FIG. 1, a coil component 1 includes: a core 10; a coil 20 wound around the core 10; a first electrode part 31, a second electrode part 32, a third electrode part 33, and a fourth electrode part 34 disposed on the core 10 and electrically connected to the coil 20 to serve as external terminals; and a plate member 15 attached to the core 10.

The core 10 has a winding core part 13 having a shape extending in a constant direction with the coil 20 wound therearound, a first flange part 11 disposed at a first end in an extending direction of the winding core part 13 and protruding in a direction orthogonal to the direction, and a second flange part 12 disposed at a second end in the extending direction of the winding core part 13 and protruding in a direction orthogonal to the direction. A material of the core 10 is preferably a magnetic material such as a sintered body of ferrite and a molded body of a magnetic powder-containing resin, for example, and may be a non-magnetic material such as alumina and resin. In the following description, it is assumed that a lower surface of the core 10 is a surface to be mounted on a mounting substrate and that a surface opposite to the lower surface of the core 10 is an upper surface of the core 10.

The first flange part 11 has an inner surface 111 facing toward the winding core part 13, an outer surface 112 facing toward the side opposite to the inner surface 111, a lower surface 113 connecting the inner surface 111 and the outer surface 112, an upper surface 114 facing toward the side opposite to the lower surface 113, and two side surfaces 115 connecting the inner surface 111 and the outer surface 112 and connecting the lower surface 113 and the upper surface 114. Similarly, the second flange part 12 has an inner surface 121 facing toward the winding core part 13, an outer surface 112 facing toward the side opposite to the inner surface 121, a lower surface 123, an upper surface 124, and two side surfaces 125. The lower surface 123, the upper surface 124, and the side surfaces 125 of the second flange part 12 face in the same directions as the lower surface 113, the upper surface 114, and the side surfaces 115, respectively, of the first flange part 11. It is noted that the lower surfaces and the upper surfaces are defined for convenience of description and may not actually correspond to the lower side and the upper side in the vertical direction.

The plate member 15 is attached to the upper surface 114 of the first flange part 11 and the upper surface 124 of the second flange part 12 by an adhesive. A material of the plate member 15 is the same as the core 10, for example. When both the core 10 and the plate member 15 are magnetic bodies, a closed magnetic path is formed, and an acquisition efficiency of inductance is increased.

The first flange part 11 has two foot parts on the lower surface 113 side, and the first electrode part 31 is disposed on one foot part while the second electrode part 32 is disposed on the other foot part. The second flange part 12 has two foot parts on the lower surface 123 side, and the third electrode part 33 is disposed on one foot part on the same side as the foot part provided with the first electrode part 31 while the fourth electrode part 34 is disposed on the other foot part on the same side as the foot part provided with the second electrode part 32. As shown in FIG. 1, the lower surface 113 and the lower surface 123 each refer to a portion including a lower surface portion of a crotch part from lower surface portions of the foot parts through slope portions of the crotch part between the foot parts. In the following description, when the first electrode part 31, the second electrode part 32, the third electrode part 33, and the fourth electrode part 34 are collectively described, these parts are described as electrode parts 31 to 34 in some cases.

The coil 20 includes a first wire 21 and a second wire 22 wound around the winding core part 13. Specifically, the coil axis of the coil 20 coincides with the extending direction of the winding core part. The first wire 21 and the second wire 22 are conductive wires with insulation coating films that are conductive wires made of metal such as copper covered with a coating film made of a resin such as polyurethane and polyamide-imide, for example. The first wire 21 has one end electrically connected to the first electrode part 31 and the other end electrically connected to the third electrode part 33. The second wire 22 has one end electrically connected to the second electrode part 32 and the other end electrically connected to the fourth electrode part 34. The first wire 21 and the second wire 22 are connected to the electrode parts 31 to 34 by thermocompression bonding, brazing, or welding, for example.

The first wire 21 and the second wire 22 are wound in the same direction around the winding core part 13. As a result, if reverse phase signals such as differential signals are input to the first wire 21 and the second wire 22, magnetic fluxes generated by the first wire 21 and the second wire 22 cancel each other, and a function as an inductor is weakened, so that the signals are allowed to pass through. On the other hand, if in-phase signals such as exogenous noise are input to the first wire 21 and the second wire 22, the magnetic fluxes generated by the first wire 21 and the second wire 22 strengthen each other, and a function as an inductor is strengthened, so that the passage of the noise is blocked. Therefore, the coil component 1 functions as a common mode choke coil attenuating a common mode signal such as exogenous noise while reducing a passage loss of a signal in a differential mode such as a differential signal.

When the coil component 1 is mounted on the mounting substrate, the lower surface of the first flange part 11 and the lower surface of the second flange part 12 face the mounting substrate. In this case, the direction of the winding core part 13 extending from the first end to the second end is parallel to a principal surface of the mounting substrate. Therefore, the coil component 1 is of a horizontally wound type in which the coil axes of the first wire 21 and the second wire 22 are parallel to the mounting substrate.

(Detailed Configuration of Coil 20)

The coil 20 has a winding region Z1 wound around the winding core part 13 and non-winding regions Z2 not wound around the winding core part 13. More specifically, the non-winding regions Z2 are regions respectively located on both sides of the winding region Z1 and connected to the electrode parts 31 to 34 separately from the winding core part 13.

Figure 2A:
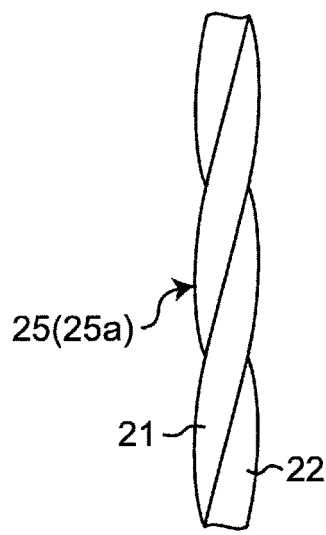
FIG. 2A is an enlarged view of a twisted wire portion of Z twist.
Figure 2B:
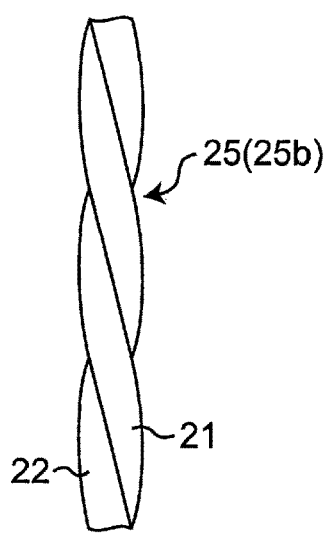
FIG. 2B is an enlarged view of a twisted wire portion of S twist.

A twisted wire portion 25 is present in the winding region Z1 of the coil 20. FIGS. 2A and 2B are enlarged views of the twisted wire portion 25. FIG. 2A shows a twisted wire portion 25a of Z twist, and FIG. 2B shows a twisted wire portion 25b of S twist. The twisting direction of the twisted wire portion 25a of Z twist is a direction opposite to the twisted direction of the twisted wire portion 25b of S twist. As shown in FIGS. 2A and 2B, the twisted wire portion 25 is a portion in which the first wire 21 and the second wire 22 are twisted together. The twisted wire portion 25 makes a relative difference (such as a line length and a bias of stray capacitance) smaller between the two wires and therefore reduces a mode conversion output such as output of a differential mode signal converted into a common mode signal or output of a signal converted in an opposite manner in the coil component 1, so that mode conversion characteristics can be made favorable. In the twisted wire portion 25 of FIGS. 2A and 2B, the first wire 21 and the second wire 22 are brought into close contact and twisted together with each other; however, the wires may have a position at which a gap is present therebetween or may be twisted together such that a gap is entirely generated therebetween. In the coil component 1, the winding region Z1 of the coil 20 is substantially made up of the twisted wire portion 25. The twisted wire portion 25 may be twisted in the direction of Z twist or S twist or may be twisted such that Z twist and S twist are mixed as described later.

Figure 3:
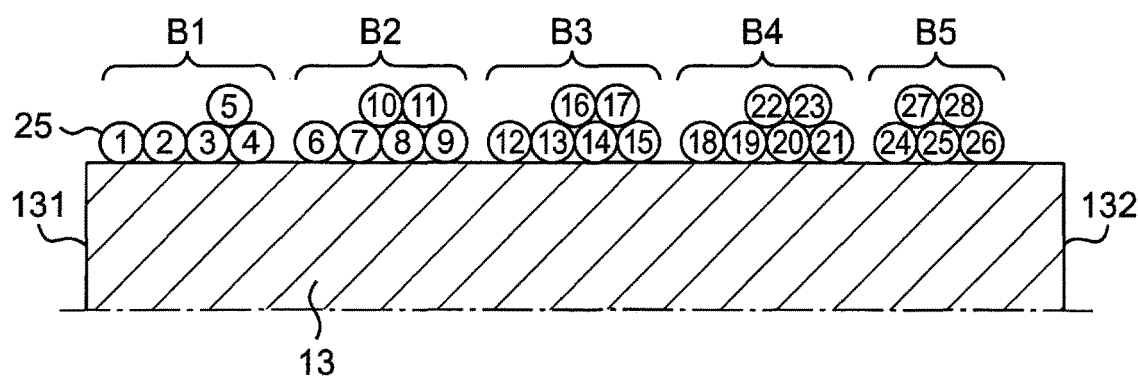
FIG. 3 is a simplified cross-sectional view of the coil component.

FIG. 3 is a simplified cross-sectional view of the coil component 1. FIG. 3 is a view showing portions of cross sections of the coil 20 and the winding core part 13 taken along the extending direction of the winding core part 13 from a first end 131 to a second end 132 of the winding core part 13 through the center of the winding core part 13. In FIG. 3, for simplicity, the twisted wire portion 25 is shown as a single wire, and a cross section thereof is simply represented by a single circular shape. In FIG. 3, the ordinal numbers of turns counted from the first end 131 side of the winding core part 13 of the coil 20 are indicated by numerals. Specifically, in the winding region Z1 of the coil 20, the twisted wire portion 25 is wound for a total of 28 turns from a first turn to a 28th turn from the first end 131 toward the second end 132 of the winding core part 13.

As shown in FIG. 3, the twisted wire portion 25 of the coil 20 has five bank regions B1, B2, B3, B4, B5 each including a first layer wound multiple turns continuously around the winding core part 13 and a second layer wound on the first layer continuously from the first layer. The first bank region B1, the second bank region B2, the third bank region B3, the fourth bank region B4, and the fifth bank region B5 are arranged in order from the first end 131 toward the second end 132 of the core part 13, and the adjacent bank regions are separated from each other. However, the first bank region B1, the second bank region B2, the third bank region B3, the fourth bank region B4, and the fifth bank region B5 may be in close contact with each other without a gap. In the following description, when the first bank region B1, the second bank region B2, the third bank region B3, the fourth bank region B4, and the fifth bank region B5 are collectively described, these bank regions are described as the first to fifth bank regions B1 to B5 in some cases.

The first layers of the first to fifth bank regions B1 to B5 are each wound directly on the winding core part 13, and the second layers are directly wound on the first layers. Specifically, in the first bank region B1, the first layer is made up of four turns from the first turn to the fourth turn continuously wound around the winding core part 13, and the second layer is made up of one turn that is the fifth turn continued from the fourth turn of the first layer and wound on the third turn and the fourth turn of the first layer. In the second bank region B2, the first layer is made up of four turns from the sixth turn to the ninth turn continuously wound around the winding core part 13, and the second layer is made up of two turns from 10th turn to 11th turn continued from the ninth turn of the first layer and continuously wound from on the seventh turn onto the ninth turn of the first layer. In the third bank region B3, the first layer is made up of four turns from the 12th turn to the 15th turn continuously wound around the winding core part 13, and the second layer is made up of two turns from 16th turn to 17th turn continued from the 15th turn of the first layer and continuously wound from on the 13th turn onto the 15th turn of the first layer. In the fourth bank region B4, the first layer is made up of four turns from the 18th turn to the 21st turn continuously wound around the winding core part 13, and the second layer is made up of two turns from 22nd turn to 23rd turn continued from the 21st turn of the first layer and continuously wound from on the 19th turn onto the 21st turn of the first layer. In the fifth bank region B5, the first layer is made up of three turns from the 24th turn to the 26th turn continuously wound around the winding core part 13, and the second layer is made up of two turns from 27th turn to 28th turn continued from the 26th turn of the first layer and continuously wound from on the 24th turn onto the 26th turn of the first layer.

In the coil component 1, as described above, the first to fourth bank regions B1 to B4 are sparsely wound with the number of turns of the upper layer (second layer) reduced by two or more as compared to the number of turns of the lower layer (first layer) immediately under the upper layer. More specifically, in the first bank region B1, the number of turns of the first layer is four, and the number of turns of the second layer is one. In the second, third, and fourth bank regions B2, B3, B4, the number of turns of the first layer is four, and the number of turns of the second layer is two. In the fifth bank region B5, the number of turns of the first layer is three, and the number of turns of the second layer is two, so that the number of turns of the second layer is reduced by one as compared to the number of turns of the first layer.

According to the coil component 1, since the coil 20 has the bank regions B1 to B5 including the second layers, the number of turns of the twisted wire portion 25 can be increased with respect to the same length of the winding core part 13 as compared to a configuration in which the twisted wire portion 25 is wound for one layer around the winding core part 13, so that a smaller size or a higher inductance can be achieved.

Since the first to fourth bank regions B1 to B4 are sparsely wound with the number of turns of the second layer reduced by two or more as compared to the number of turns of the first layer, a line capacity generated by overlapping in the twisted wire portion 25 can be reduced, so that deterioration in mode conversion characteristics can be suppressed.

Therefore, while a smaller size or a higher inductance is achieved, the deterioration in mode conversion characteristics can be suppressed.

Generally, from the viewpoint of a smaller size or a higher inductance, it is desirable to wind the second layer with the number of turns increased as much as possible so as to improve the efficiency of winding of the coil 20 around the winding core part 13. In reality, due to stability of a winding shape of the first wire 21 and the second wire 22, as shown in FIG. 3, the second layer is wound on recesses formed between adjacent turns of the first layer. Therefore, if the second layer is wound as much as possible within a feasible range, as in the fifth bank region B5, the bank region is closely wound with the second layer reduced by one turn as compared to the first layer.

On the other hand, unlike the idea described above, the first to fourth bank regions B1 to B4 of the coil component 1 are sparsely wound with the number of turns of the second layer reduced by two or more as compared to the number of turns of the first layer. In other words, the configuration of the coil component 1 is conceived for the first time based on the present inventors' new discovery that useful characteristics can be acquired by reducing the line capacity generated by overlapping in the twisted wire portion 25 to suppress deterioration in mode conversion characteristics, even at some sacrifice of the efficiency of winding of the coil 20 around the winding core part 13.

In the coil component 1, as shown in FIG. 3, the first to fourth bank regions B1 to B4 have the second layers shifted toward the final turns of the first layers. Specifically, in the first to fourth bank regions B1 to B4, the respective second layers are shifted toward the final turns of the first layers, i.e., the turns of the first layers wound around the winding core part immediately before portions connecting the first layers and the second layers, which are the fourth turn of the first bank region B1, the ninth turn of the second bank region B2, the 15th turn of the third bank region B3, and the 21st turn of the fourth bank region B4. This can shorten the length of the twisted wire portion 25 connecting the first layer and the second layer and can reduce the line capacity generated in the twisted wire portion 25 connecting the first layer and the second layer. Additionally, since the second layer comes closer to the side of the first layer close to the second layer in terms of the ordinal number of the turn, the combined line capacity of the entire twisted wire portion 25 can be reduced.

Particularly, in the first to fourth bank regions B1 to B4 of the coil component 1, the second layer includes a portion wound on the final turn of the first layer. Specifically, in the first to fourth bank regions B1, B2, B3, B4, the second layers respectively include the fifth turn wound on the fourth turn, the 11th turn wound on the ninth turn, the 17th turn wound on the 15th turn, and the 23rd turn wound on the 21st turn. This can further shorten the length of the twisted wire portion 25 connecting the first layer and the second layer and can further reduce the line capacity generated in the twisted wire portion 25 connecting the first layer and the second layer. Additionally, since a portion of the second layer is wound on the final turn of the first layer having the ordinal number of the turn closest to the second layer, the combined line capacity of the entire twisted wire portion 25 can further be reduced.

In the first bank region B1 of the coil component 1, the number of turns of the second layer, i.e., the uppermost layer, is one. As a result, the line capacity generated in the uppermost layer can further be reduced.

In the first to fourth bank regions B1 to B4 of the coil component 1, the number of turns of the first layer is five or less. By setting the number of turns of the first layer to five or less, a difference in the ordinal number of the turn can be reduced between the first layer and the second layer, so that the combined line capacity of the entire twisted wire portion 25 can further be reduced.

In the coil component 1, the twisted wire portion 25 has a plurality of the bank regions B1 to B5 including the first to fourth bank regions B1 to B4 along the winding core part 13. Since the plurality of the bank regions B1 to B5 is included, the number of turns of the twisted wire portion 25 can further be increased with respect to the same length of the winding core part 13 as compared to a configuration in which the twisted wire portion 25 is wound for one layer around the winding core part 13, so that the size can further be reduced or the inductance can further be increased. Additionally, since the number of turns of the entire portion is divided into the plurality of the bank regions B1 to B5, the number of turns of the first layer is reduced in each of the bank regions. As a result, a difference in the ordinal number of the turn can be reduced between the first layer and the second layer, so that the combined line capacity of the entire twisted wire portion 25 can further be reduced.

In the coil component 1, the second to fourth bank regions B2 to B4 excluding the first and fifth bank regions B1, B5 at both ends have the same shapes. As a result, the directionality generated in the capacity between the first wire 21 and the second wire 22 can further be reduced. If at least two bank regions of the plurality of bank regions have the same shapes, the directionality generated in the capacity between the first wire and the second wire can be reduced.

In the coil component 1, the number of layers of each of the first to fifth bank regions B1 to B5 is two, and in the second to fourth bank regions excluding the first and fifth bank regions B1, B5 at both ends, the number of turns of the first layer is four, and the number of turns of the second layer is two. Therefore, a balance can be achieved between the reduction in the line capacity and the suppression of reduction in manufacturing efficiency.

In the coil component 1, the first wire 21 and the second wire 22 are untwisted from each other in portions of the winding region Z1 adjacent to the non-winding regions Z2 of the coil 20. As a result, the first wire 21 and the second wire 22 can be spaced at a starting end of winding or a terminal end of winding where a stress is applied to the first wire 21 and the second wire 22, so that occurrence of damage of the wires such as disconnection of the wires and short circuit between the wires can be reduced.

In the coil component 1, preferably, the twisted wire portion 25 has an inverted portion in which the twisting direction is inverted, and this reduces superposition of twisting in the twisted wire portion 25, so that the reliability of the wires is increased. Additionally, the twisted wire portion 25 preferably has a plurality of inverted portions and has a position where the adjacent inverted portions are arranged at equal intervals, and this can reduce the line capacity of the twisted wire portion 25 and a bias of capacity between the mounting substrate and the wires. Specifically, the twisted wire portion 25 may have an inverted portion between each two of the first to fifth bank regions B1 to B5 so that an even number of the inverted portions is included. In this case, the intervals between the adjacent inverted portions are about six in number of turns and become equal to each other. As described above, "the intervals between the adjacent inverted portions" are based on the number of turns of the twisted wire portion 25.

In the coil component 1, the number of twists per turn of the twisted wire portion 25 is an integer. As a result, the twisted wire portion 25 is rotated by a multiple of 360° per turn, and therefore, the state of the twisted wire portion 25 (such as the numbers and positions of nodes and loops of twists and a positional relationship between the wires) become equal between turns, resulting in a stable winding shape. Additionally, the number of twists per turn of the twisted wire portion 25 is four, for example; however, the number of twists per turn is not limited thereto and may be one to three, or five or more.

The twisted wire portion 25 may have an odd number of the inverted portions, and this makes the numbers of appearances of the twisting directions of the twisted wire portion 25 equal when the twisted wire portion 25 is wound around the winding core part 13 at the time of manufacturing of the coil component 1, i.e., this makes the number of the twisted wire portions 25 of Z twist equal to the number of the twisted wire portions 25 of S twist, so that the occurrence of kinks can be reduced in the first wire 21 and the second wire 22.

(Detailed Configuration of Electrode Parts 31 to 34)

Figure 4:
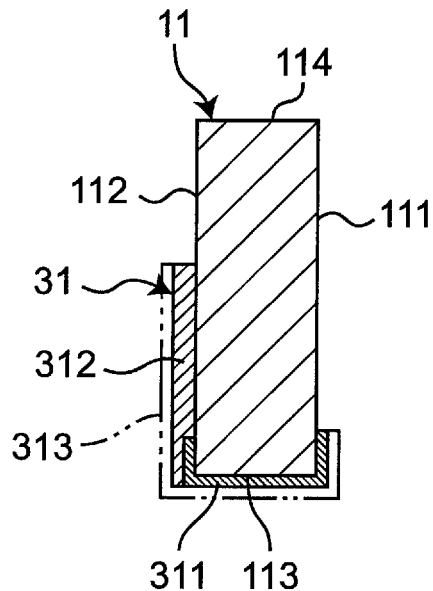
FIG. 4 is a simplified cross-sectional view of a first flange part of the coil component.

As shown in FIGS. 1 and 4, the first electrode part 31 has a lower-surface-side base electrode 311 disposed on the lower surface 113, and an outer-surface-side base electrode 312 disposed on the outer surface 112. The outer-surface-side base electrode 312 has a shape extending from on an end portion of the lower-surface-side base electrode 311 on the outer surface 112 side onto the outer surface 112.

Specifically, the lower-surface-side base electrode 311 is disposed on one of the foot parts of the lower surface 113 to cover the entire surface of the lower surface portion of the one foot part and portions on the lower surface 113 side of the inner surface 111, the outer surface 112, and the side surface 115 therearound. The outer-surface-side base electrode 312 overlaps the end portion of the lower-surface-side base electrode 311 on the outer surface 112 side and has a shape extending from on the end portion toward the upper surface 114 to a middle part on the outer surface 112. In other words, the outer-surface-side base electrode 312 has a shape extending from a middle part on the outer surface 112 of the first flange part 11 toward the lower surface 113 and climbing onto the end portion of the lower-surface-side base electrode 311 on the outer surface 112 side.

According to the coil component 1, the outer-surface-side base electrode 312 extending from on the lower-surface-side base electrode 311 onto the outer surface 112 is separately included in addition to the lower-surface-side base electrode 311 on the lower surface 113, and therefore, a fillet can be formed due to wetting of a mounting solder occurring from the lower surface 113 along the outer surface 112 at the time of mounting, so that the fixing force is increased between the coil component 1 and the mounting substrate. Particularly, if the coil component 1 is reduced in size, an amount of mounting solder is also reduced; however, since the fillet can be formed, the fixing force can be increased between the coil component 1 and the mounting substrate. Additionally, since this embodiment can be implemented by adding the outer-surface-side base electrode 312 of this embodiment to the conventional lower-surface-side base electrode 311, an existing facility can be diverted, so that an additional burden required for manufacturing of the coil component 1 can be reduced. Since each of the lower-surface-side base electrode 311 and the outer-surface-side base electrode 312 can independently be designed and manufactured, a degree of freedom in design and ease of manufacturing are improved. Therefore, for increasing the fixing force, the coil component 1 has a configuration that is suitable for reduction in size, low cost, and easy to manufacture with a high degree of freedom in design.

In the coil component 1, the coil 20 has the twisted wire portion 25 in which the first wire 21 and the second wire 22 are twisted together, and in this case, the configuration of the first electrode part 31 is more effective. Specifically, when the twisted wire portion 25 is wound around the winding core part 13, as compared to when the first wire 21 and the second wire 22 are wound around the winding core part 13 without being twisted, a gap is more easily formed between the turns, which increases the length of the winding core part 13 required for winding of the same number of turns. Therefore, when the coil 20 has the twisted wire portion 25, the lengths of the first flange part 11 and the second flange part 12 are sacrificed so as to ensure the length of the winding core part 13, and the areas of the electrode parts 31 to 34 tend to be smaller, so that the effect of increasing the fixing force becomes effective.

In the coil component 1, the lower-surface-side base electrode 311 is a sintered body, and the outer-surface-side base electrode 312 is a metal film. The lower-surface-side base electrode 311 is a sintered body acquired by baking a conductive paste such as Ag glass paste applied by a dipping method, for example. The outer-surface-side base electrode 312 is a metal film formed by sputtering, for example.

As a result, since the lower-surface-side base electrode 311 is a sintered body, the strength and impact resistance of the lower-surface-side base electrode 311 itself can be ensured, and the fixing force can be ensured between the lower-surface-side base electrode 311 and the first flange part 11. On the other hand, since the outer-surface-side base electrode 312 is a metal film and therefore can be made thinner, an influence on the mounting area can be reduced on the mounting substrate.

Preferably, the lower-surface-side base electrode 311 contains glass and Ag. As a result, the strength and impact resistance of the lower-surface-side base electrode 311 itself can further be ensured, and the fixing force can further be ensured between the lower-surface-side base electrode 311 and the first flange part 11.

Preferably, the outer-surface-side base electrode 312 includes a NiCu layer. As a result, high toughness is ensured even if the outer-surface-side base electrode 312 is a thin film, and the influence on the mounting area is reduced while the thermal shock resistance is improved. The outer-surface-side base electrode 312 preferably includes a NiCr layer on the first flange part 11 as a lower layer of the NiCu layer, i.e., preferably has a configuration including the NiCu layer covering the NiCr layer. As a result, the lower NiCr layer improves adhesiveness between the outer-surface-side base electrode 312 and the first flange part 11.

Preferably, the first electrode part 31 has a metal coating film 313 as indicated by an imaginary line of FIG. 4. The metal coating film 313 covers the lower-surface-side base electrode 311 and the outer-surface-side base electrode 312. As a result, the lower-surface-side base electrode 311 and the outer-surface-side base electrode 312 are integrated by the metal coating film 313, so that mounting reliability is improved. If the outer-surface-side base electrode 312 includes the upper NiCu layer, the upper NiCu layer improves adhesiveness between the outer-surface-side base electrode 312 and the metal coating film 313.

Preferably, the metal coating film 313 includes a Ni layer and a Sn layer. This improves solder wettability of the first electrode part 31 and corrosion resistance suppressing elution of the first wire 21 and the base electrodes 311, 312 to the mounting solder at the time of mounting. In this case, the metal coating film 313 preferably further includes a Cu layer. As a result, the stress generated in the first electrode part 31 is relaxed, and the corrosion resistance is further improved.

In this case, the Cu layer, the Ni layer, and the Sn layer are preferably arranged in order from the inside to the outside. As a result, the stress generated in the first electrode part 31 is relaxed, and the solder wettability and the corrosion resistance are improved. More specifically, the Sn layer disposed on the outermost layer improves the wettability of the mounting solder at the time of mounting and improves the connectivity of the first wire 21 to the first electrode part 31. The Ni layer disposed between the Sn layer and the base electrodes 311, 312 reduces the elution of the base electrodes 311, 312 to the mounting solder during mounting. The Cu layer disposed as a lower layer of the Ni layer serves as a relatively soft buffer layer in a lower portion of the relatively hard Ni layer so that the stress generated in the first electrode part 31 is relaxed, and the Cu layer is eluted into the mounting solder instead of the base electrodes 311, 312 so that the corrosion resistance is improved. The Cu layer is not limited to the lower layer of the Ni layer (between the Ni layer and the base electrodes 311, 312) and may be, for example, an upper layer of the Ni layer (between the Ni layer and the Sn layer). As a result, the Cu layer is eluted to the mounting solder instead of the first wire 21, so that the corrosion resistance of the first wire 21 is improved.

However, the metal coating film 313 is not limited to the configuration described above and, for example, the metal coating film 313 may have a configuration including a Pd layer or an Au layer as the outermost layer. This improves the solder wettability and the corrosion resistance of the first electrode part 31. Additionally, as a result, either or both of the Cu layer and the Sn layer can be eliminated, so that the metal coating film 313 can be made thinner.

Although the configuration of the first electrode part 31 has been described above, the second electrode part 32, the third electrode part 33, and the fourth electrode part 34 of the coil component 1 each have the same configuration as the first electrode part 31. As a result, since the second electrode part 32, the third electrode part 33, and the fourth electrode part 34 each have the same configuration as the first electrode part 31, the fixing force is further increased between the coil component and the mounting substrate, and the degree of freedom in design and the ease of manufacturing are further improved. However, the present disclosure is not limited to the configuration described above, and any two or any three of the electrode parts 31 to 34 may have the same configuration. At least one of the electrode parts 31 to 34 only needs to satisfy the configuration described above.

(Detailed Configuration of First Flange Part 11 and Second Flange Part 12)

Figure 5:
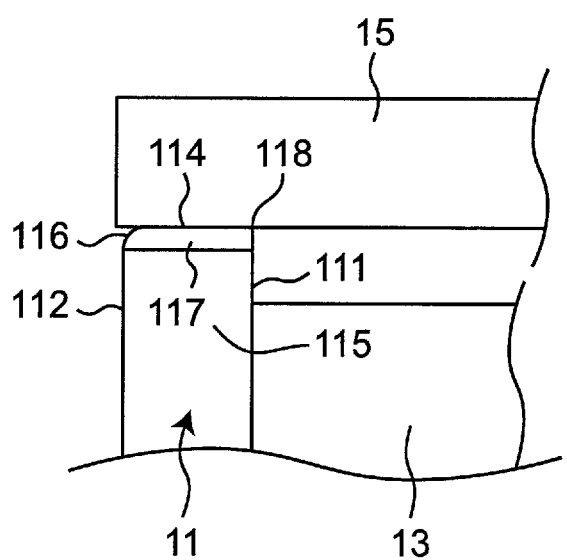
FIG. 5 is a simplified cross-sectional view showing a preferable form of the first flange part.

As shown in FIG. 5, preferably, the first flange part 11 has a first chamfered portion 116 between the upper surface 114 and the outer surface 112 and a second chamfered portion 117 between the upper surface 114 and each of the two side surfaces 115. The first and second chamfered portions 116, 117 are portions chamfered into an upward-convex curved surface shape. As a result, if the plate member 15 is bonded to the upper surface 114 of the first flange part 11 and the upper surface 124 of the second flange part 12, an adhesive pool is formed on the first and second chamfered portions 116, 117 of the first flange part 11, so that the adhesive hardly leaks toward the outer surface 112 or the side surface 115 of the first flange part 11. The first and second chamfered portions 116, 117 may be chamfered into a downward-convex curved surface shape or a flat surface shape.

Preferably, the first flange part 11 has a ridgeline 118 between the inner surface 111 and the upper surface 114. The ridgeline 118 is a non-chamfered portion. As a result, if the plate member 15 is bonded to the upper surface 114 of the first flange part 11 and the upper surface 124 of the second flange part 12, an area of connection with the plate member 15 is increased and a magnetic path length is shortened at an end portion of the upper surface 114 of the first flange part 11 on the inner surface 111 side where the magnetic flux tends to concentrate, so that a reduction in inductance value is suppressed. Alternatively, a small chamfered portion having a width smaller than the first and second chamfered portions 116, 117 may be disposed between the inner surface 111 and the upper surface 114 instead of the ridgeline 118. Even in this case, as with the ridgeline 118, a magnetic path length is shortened, so that a reduction in inductance value is suppressed. The phrase "the chamfered portion is small" means, for example, that if the chamfered portion has a curved surface shape, the curved surface has a small curvature radius, and that if the chamfered portion has a flat surface shape, the flat surface has a small traverse length.

Figure 6:
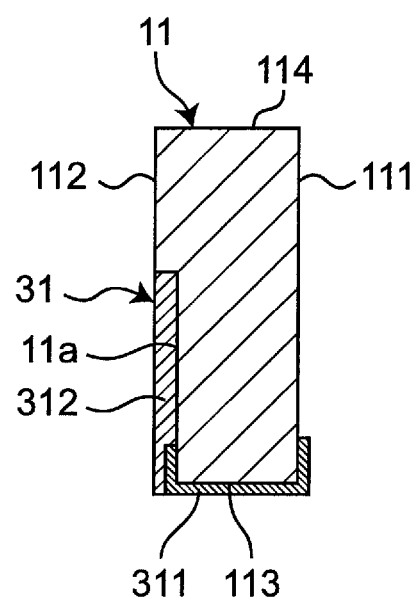
FIG. 6 is a simplified cross-sectional view showing a preferable form of the first flange part.

As shown in FIG. 6, preferably, the outer surface 112 of the first flange part 11 is provided with a groove portion 11a extending from the lower surface 113 side to the upper surface 114 side, and the outer-surface-side base electrode 312 is embedded in the groove portion 11a. This can prevent the outer-surface-side base electrode 312 and the metal coating film 313 on the outer-surface-side base electrode 312 from unnecessarily extending on the outer surface 112, and can reduce the first electrode part 31 and the second electrode part 32 adjacent to each other from being connected via the outer-surface-side base electrode 312 and the metal coating film 313, so that a further reduction in size can be achieved.

Although the configuration of the first flange part 11 has been described above, the second flange part 12 of the coil component 1 has the same configuration as the first flange part 11. As a result, since the second flange part 12 has the same configuration as the first flange part 11, the effect described above is more effectively produced. At least one of the first flange part 11 and the second flange part 12 only needs to satisfy the configuration described above.

(Detailed Configuration of Parts)

(Plate Member 15)

The plate member 15 has a length of about 3.3 mm, a width of about 2.6 mm, and a thickness of about 0.7 mm. The thickness of the plate member 15 is preferably 0.3 to 2.0 mm, and when the thickness is 0.3 mm or more, the inductance value can be ensured, and when the thickness is 2.0 mm or less, a reduction in height can be achieved. The plate member 15 is preferably chemically cleaned, and this increases wettability of an adhesive used for bonding to the core 10 and a fixing force between the core 10 and the plate member 15. The lower surface of the plate member 15 preferably has a flatness of 5 μm or less, and this reduces a gap generated with the first flange part 11 and the second flange part 12, so that a reduction in inductance value is suppressed. The length and the width of the plate member 15 are preferably about 0.1 mm larger than the length and the width of the core 10, and this ensures a connection area overlapping with the first flange part 11 and the second flange part 12 against deviation in a length direction and a width direction tending to occur at the time of bonding of the plate member 15 to the core 10, so that a stable closed magnetic path is formed, and therefore, a decrease in inductance value is suppressed.

(Core 10)

The winding core part 13 of the core 10 has a shape extending from the first end 131 toward the second end 132 and has a hexagonal cross section orthogonal to the extending direction of the winding core part 13. However, the cross section may have another polygonal shape such as a quadrangular shape, a circular shape, an elliptical shape, or a shape acquired by appropriately combining these shapes.

The core 10 has a length of about 3.2 mm, a width of about 2.5 mm, and a thickness of about 1.7 mm. The length is the distance between the outer surfaces 112, 122 of the first flange part 11 and the second flange part 12, the width is the distance between the first side surface 115 and the second side surface 115 of the first flange part 11, and the thickness is the distance between the lower surface 113 and the upper surface 114 of the first flange part 11. The core 10 has a distance (standoff) of about 0.7 mm from the lower surfaces 113, 123 of the first and second flange parts 11, 12 to the lower end of the winding core part 13. The standoff is preferably 0.50 to 1.50 mm, and when the standoff is 0.50 mm or more, stray capacitance generated between the mounting substrate and the wires 21, 22 is reduced. Additionally, since a distance is ensured from a separation portion between the first wire 21 and the second wire 22 to a portion of thermocompression bonding of the wires 21, 22 to the electrode parts 31 to 34, the stress generated at the separation portion is relaxed, so that disconnection of the wires 21, 22 and short circuit between wires due to coating breakage is reduced. When the standoff is 1.50 mm or less, a reduction in height can be achieved, and the thickness of the plate member 15 can be ensured. Both the length direction and the width direction are parallel to the mounting substrate on which the coil component 1 is mounted, and the extending direction of the winding core part 13 is the length direction while the direction orthogonal to the length direction is the width direction. A height direction is a direction orthogonal to the mounting substrate, and the length direction, the width direction, and the height direction are orthogonal to each other.

The core 10 is preferably chemically cleaned, and this increases wettability of an adhesive used for bonding to the plate member 15 and the fixing force between the core 10 and the plate member 15. The surfaces of the first flange part 11 and the second flange part 12 facing the plate member 15 preferably have a flatness of 5 µm or less, and this reduces a gap generated with the plate member 15, so that a reduction in inductance value is suppressed. The ridgelines are preferably chamfered between the outer surfaces 112, 122, the side surfaces 115, 125, and the upper faces 114, 124 of the first flange part 11 and the second flange part 12. As a result, pools of the adhesive used for bonding to the plate member 15 are formed on the upper surface end portions of the first flange part 11 and the second flange part 12 on the outer surface side and the side surface side, so that the adhesive hardly leaks toward the outer surfaces and the side surfaces of the first flange part 11 and the second flange part 12. On the other hand, the ridgelines between the inner surfaces 111, 121 and the side surfaces 115, 125, and the ridgelines between the inner surfaces 111, 121 and the upper surfaces 114, 124 are preferably not chamfered, and this increases an area of connection with the plate member 15 and shortens a magnetic path length at the upper surface end portions of the flange part 11 and the second flange part 12 on the inner surface side, so that a reduction in inductance value is suppressed. The thickness of the winding core part 13 is about 0.6 mm. The thickness of the winding core part 13 is preferably 1 mm or less, and as a result, the standoff and the thickness of the plate member 15 are ensured at the same time.

(First and Second Wires 21, 22)

The first wire 21 and the second wire 22 are made up of a conductor wire of a good conductor such as Cu, Ag, and Au, and a coating film of resin such as imide modified polyurethane, polyimide amide, and fluorine resin covering the conductor wire. For example, the conductor wire has a wire diameter of 30 µm and the coating film is 10 µm. Preferably, the conductor diameter is 15 to 100 µm, and the coating film is about 8 to 20 µm. A surface of the coating film may be coated with an activator etc.

(Manufacturing Method of Coil Component 1)

A manufacturing method of the Coil component 1 will hereinafter be described. The manufacturing method of the coil component 1 includes a step of forming the first twisted wire portion 25*a* (see FIG. 2A) by twisting the first wire 21 and the second wire 22 together in a first twisting direction, for example, a Z-twist direction, a step of forming the second twisted wire portion 25*b* (see FIG. 2B) by twisting the first wire 21 and the second wire 22 together in a second twisting direction, for example, an S-twist direction, a step of winding the first twisted wire portion 25*a* around the winding core part 13 of the core 10 to manufacture a first coil component 1*a* (see FIG. 8), and a step of winding the second twisted wire portion 25*b* around the winding core part 13 of the core 10 to manufacture a second coil component 1*b* (see FIG. 8). This allows mixing the first coil component 1*a* having the twisting direction of the twisted wire portion 25 opposite to the second coil component 1*b* and therefore eliminates the need for continuously revolving a winding nozzle always in a constant direction at the time of manufacturing of the coil component 1, so that the occurrence of kinks can be reduced in the first wire 21 and the second wire 22.

Figure 7:
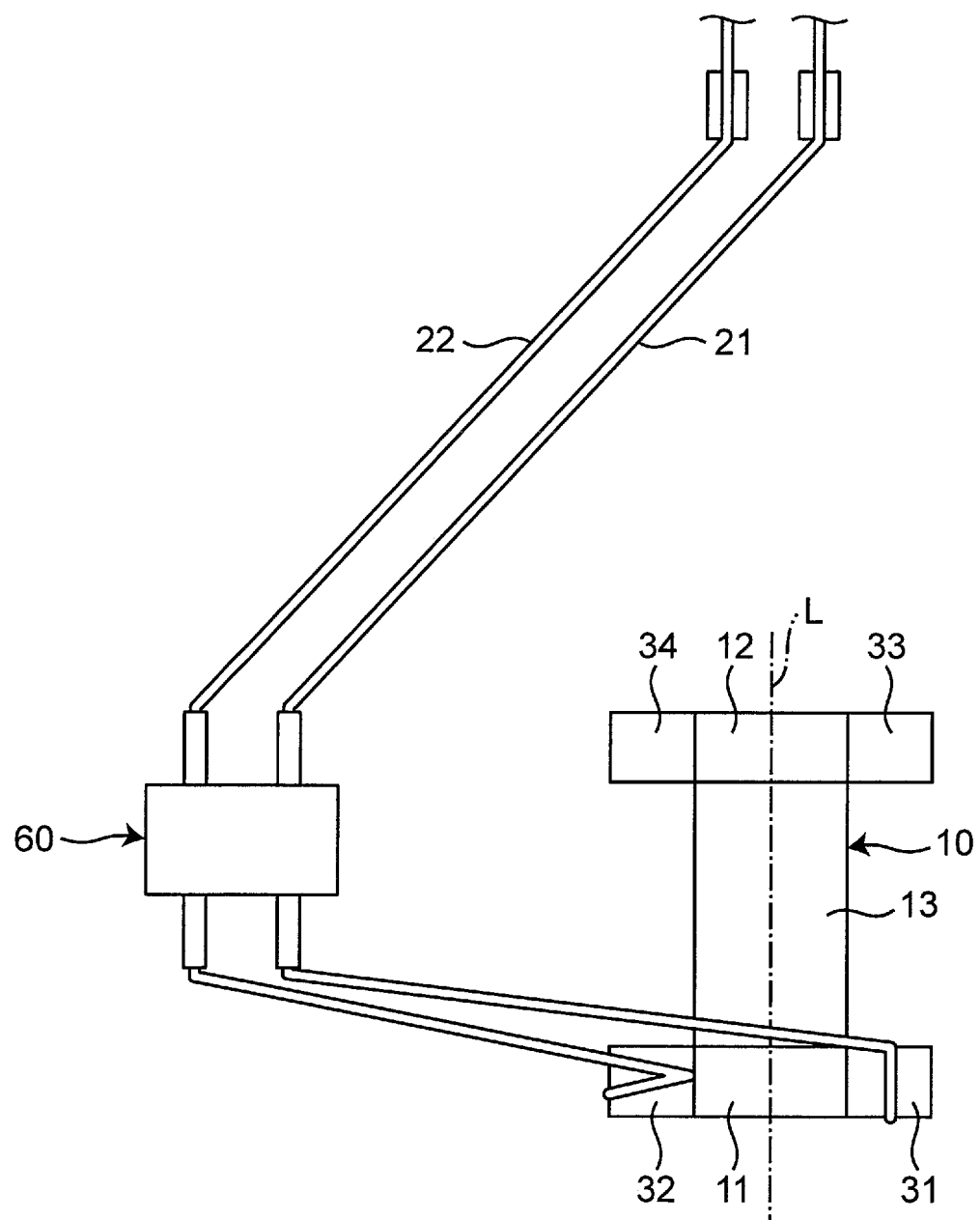
FIG. 7 is an explanatory view for explaining a method of forming the twisted wire portion.

Specifically, as shown in FIG. 7, at the step of forming the first twisted wire portion 25*a*, a winding nozzle 60 holding the first wire 21 and the second wire 22 is not rotated around its own axis and is revolved around the winding core part 13 of the core 10 (i.e., around an axis L of the winding core part 13) in a first direction, for example, clockwise. On the other hand, at the step of forming the second twisted wire portion 25*b*, the winding nozzle 60 is not rotated around its own axis and is revolved around the winding core part 13 of the core 10 in a direction opposite to the first direction, for example, counterclockwise. As a result, since the winding nozzle 60 is revolved in the opposite directions at the step of forming the first twisted wire portion 25*a* and the step of forming the second twisted wire portion 25*b*, torsion hardly remains in the first wire 21 and the second wire 22.

In the manufacturing method, the number of the inverted portions of the twisted wire portion 25 is preferably an even number. In this case, the twisting direction of the twisted wire portion 25 wound around the winding core part 13 becomes the same at the beginning and the end at the time of manufacturing of the coil component 1, so that torsion tends to remain in the first wire 21 and the second wire 22 for each manufacturing unit. Therefore, this makes more effective the effect of reducing the occurrence of kinks in the first wire 21 and the second wire 22 by the manufacturing method described above allowing mixing the coil component 1 having the opposite twisting direction of the twisted wire portion 25.

(Packing Form of Coil Component)

Figure 8:
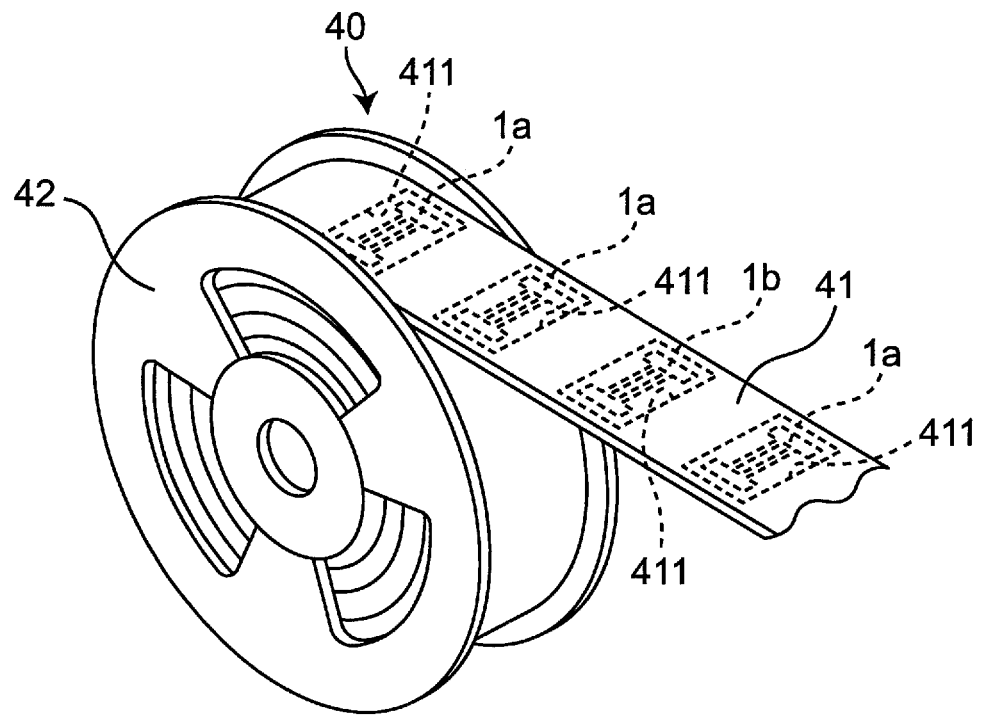
FIG. 8 is a simplified view showing a packing form of the coil component.

FIG. 8 is a simplified diagram showing a packing form of the coil component 1. As shown in FIG. 8, a plurality of the coil components 1 is packed in a taping reel 40. The taping reel 40 has a tape 41 and a reel 42 around which the tape 41 is wound. The tape 41 has a plurality of pockets 411 arranged along a longitudinal direction and each having one of the coil components 1 stored therein. The number of the coil components 1 packed in the taping reel 40 is 8000, for example.

In the pockets 411, the first coil components 1*a* and the second coil components 1*b* manufactured by the manufacturing method of the coil component 1 are stored in a mixed manner. Therefore, in the taping reel 40, the plurality of the coil components 1 includes the first coil component 1*a* having the twisting direction of the twisted wire portion 25*a* opposite to the twisting direction of the twisted wire portion 25*b* of the second coil component 1*b*. This allows mixing the first coil component 1*a* having the twisting direction of the twisted wire portion 25 opposite to the second coil component 1*b* and therefore eliminates the need for continuously revolving the winding nozzle always in a constant direction at the time of manufacturing of the coil component 1, so that the occurrence of kinks can be reduced in the first wire 21 and the second wire 22.

As in the manufacturing method of the coil component 1, the winding direction of the coil 20 around the winding core part 13 is opposite between the first coil component 1*a* and the second coil component 1*b*. Specifically, the winding direction of the coil 20 around the winding core part 13 in the first coil component 1*a* is clockwise, for example, and the winding direction of the coil 20 around the winding core part 13 in the other second coil component 1*b* is counterclockwise, i.e., the opposite direction. As a result, since the direction of revolving of the winding nozzle can easily be changed to the opposite direction at the time of manufacturing of the first coil component 1a and the second coil component 1b, the occurrence of kinks can easily be reduced in the first wire 21 and the second wire 22.

In the case that the twisted wire portions of the first and second coil components 1a, 1b have inverted portions in which the twisting direction is inverted, when the twisting direction of the twisted wire portion of the first coil component 1a is opposite to the twisting direction of the twisted wire portion of the second coil component 1b, this means that, for example, while the twisting direction of the twisted wire portion of the first coil component 1a changes in the order of S twist, Z twist, and S twist, the twisting direction of the twisted wire portion of the second coil component 1b changes in the order of Z twist, S twist, and Z twist.

In the taping reel 40, preferably, as shown in FIG. 8, two or more of the pockets 411 having the first coil components 1a stored therein are arranged in succession. For example, in a manufacturing process of the coil component 1, even if the components having the opposite twisting directions of the twisted wire portion 25 are alternately manufactured, those judged as NG in appearance inspection or characteristic inspection are excluded from the coil components 1 flowing at a step of storing into the pockets 411 of the tape 41, so that the order of manufacturing does not normally coincide with the order of storage. Therefore, if it is attempted to alternately arrange those having the opposite twisting directions of the twisted wire portion 25 for the coil components 1 in the taping reel 4, a step is required for rearranging the order of the coil components 1 depending on the twisting direction, for example, selecting and arranging the first coil component 1a and the second coil component 1b, before the step of storing into the pockets 411 of the tape 41 after the appearance inspection and the characteristic inspection. In contrast, if two or more of the pockets 411 having the first coil components 1a stored therein are arranged in succession as described above, since storing the first coil components 1a in succession in the tape 41 is allowed, the step of rearranging the order of the coil components 1 is not necessary before the step of storing the coil components 1 into the tape 41 after the appearance inspection and the characteristic inspection, so that a manufacturing time per taping reel 40 can be shortened.

Particularly, the taping reel 40 preferably has a portion in which the number of the continuously arranged pockets 411 having the first coil components 1a stored therein is different from the number of the continuously arranged pockets 411 having the second coil components 1b stored therein. Specifically, a manufacturing method of the taping reel 40 includes a step of manufacturing the first coil component 1a and the second coil component 1b, a step of preparing the tape 41 having the plurality of the pockets 411 arranged along the longitudinal direction, a step of storing the first coil component 1a in one of the pockets 411, and a step of storing the second coil component 1b in one of the pockets 411, and the step of storing the first coil component 1a and the step of storing the second coil component 1b are preferably irregularly performed. Since this allows storing the first coil components 1a and the second coil components 1b irregularly in the plurality of the pockets 411, the step of rearranging the order of the coil components 1 is not necessary before the step of storing the coil components 1 into the tape 41, so that a manufacturing time per taping reel 40 can be shortened.

The coil components 1 taken out from the taping reel 40 as described above may be mounted on a mounting substrate to manufacture an electronic component. Therefore, the electronic component includes the mounting substrate and a plurality of the coil components 1 mounted on the mounting substrate. The plurality of the coil components 1 includes the first coil component 1a having the twisting direction of the twisted wire portion 25 opposite to the twisting direction of the twisted wire portion 25 of the other second coil component 1b. This allows mixing the first coil component 1a having the twisting direction of the twisted wire portion 25 opposite to the other second coil component 1b and therefore eliminates the need for continuously revolving the winding nozzle always in a constant direction at the time of manufacturing of the coil component 1, so that the occurrence of kinks can be reduced in the first wire 21 and the second wire 22.

Second Embodiment

Figure 9:
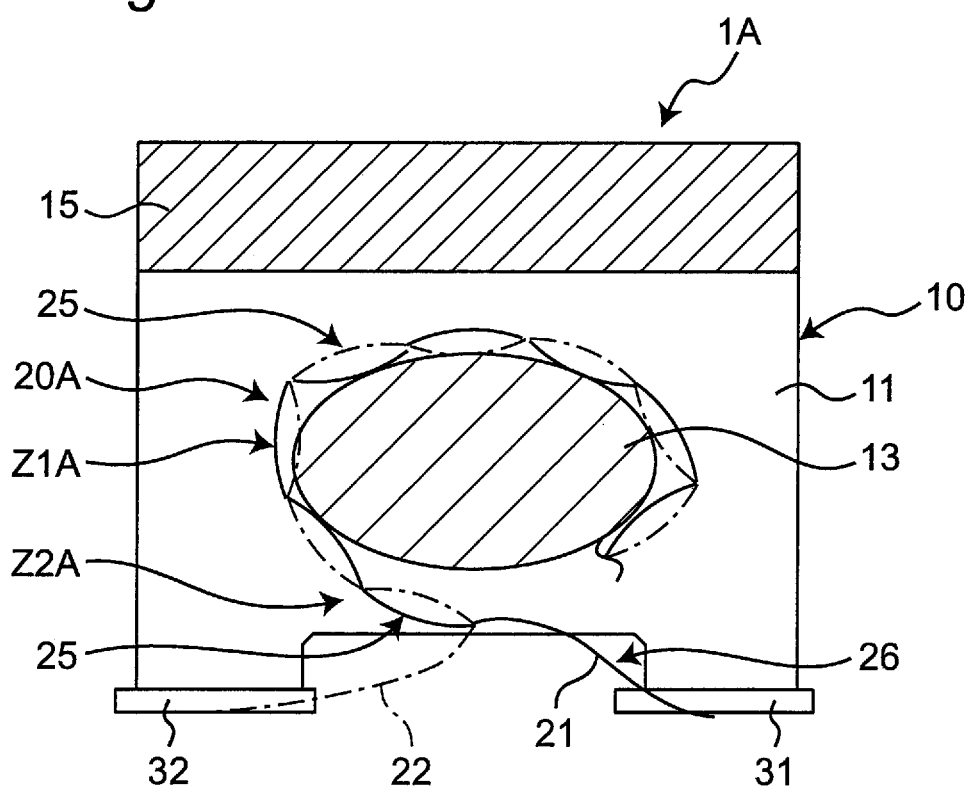
FIG. 9 is a simplified cross-sectional view showing a second embodiment of the coil component.

FIG. 9 is a simplified cross-sectional view showing a second embodiment of the coil component. The second embodiment is different from the first embodiment in twisting positions of wires. This different configuration will hereinafter be described. The other configurations are the same as those of the first embodiment and are denoted by the same reference numerals as the first embodiment and will not be described.

As shown in FIG. 9, in a coil component 1A according to the second embodiment, the first wire 21 (indicated by a solid line) and the second wire 22 (indicated by a dashed-dotted line) are twisted together from a portion of a non-winding region Z2A over an entire winding region Z1A of a coil 20A. Therefore, the coil component 1A has the twisted wire portion 25 not only in the winding region Z1A of the coil 20A but also in the non-winding region Z2A of the coil 20A, and a portion of the non-winding region Z2A adjacent to the winding region Z1A is the twisted wire portion 25. Therefore, a difference in line length between the first wire 21 and the second wire 22 and a bias of line capacity between the first wire 21 and the second wire 22 can further be reduced, so that the deterioration in mode conversion characteristics can be reduced.

To give the twisted wire portion 25 also to the non-winding region Z2A of the coil 20A as described above, for example, the twisted wire portion 25 may be formed in advance before the coil 20A is wound around the winding core part 13, and a portion of the twisted wire portion 25 may be left for the non-winding region Z2A rather than using all the twisted wire portion 25 for the winding region Z1A.

The non-winding region Z2A has a non-twisted wire portion 26 continued from the twisted wire portion 25 and having the first wire 21 and the second wire 22 untwisted from each other, and in the non-twisted wire portion 26, the length of the first wire 21 and the length of the second wire 22 are the same. Therefore, a difference in line length between the first wire 21 and the second wire 22 and a bias of line capacity between the first wire 21 and the second wire 22 can be reduced also in the non-winding region Z2A, so that the deterioration in mode conversion characteristics can further be reduced.

To make the length of the first wire 21 and the length of the second wire 22 equal to each other in the non-twisted wire portion 26 as described above, for example, the twisted wire portion 25 formed in advance may partially be untwisted in the non-winding region Z2A. In this regard, a trace of twisting may remain as a bending shape on the first wire 21 and the second wire 22 that are untwisted, and in this case, the first wire 21 and the second wire 22 may have the same or different bending shape in a region connected to the electrode parts 31 to 34 from the final end of the twisted wire portion 25. Particularly, the bending shape is preferably a shape directed toward the electrode parts 31 to 34 connected to each other, and this prevents a stress from occurring in the first wire 21 and the second wire 22 at the time of connection, so that occurrence of disconnection can be reduced.

Third Embodiment

Figure 10:
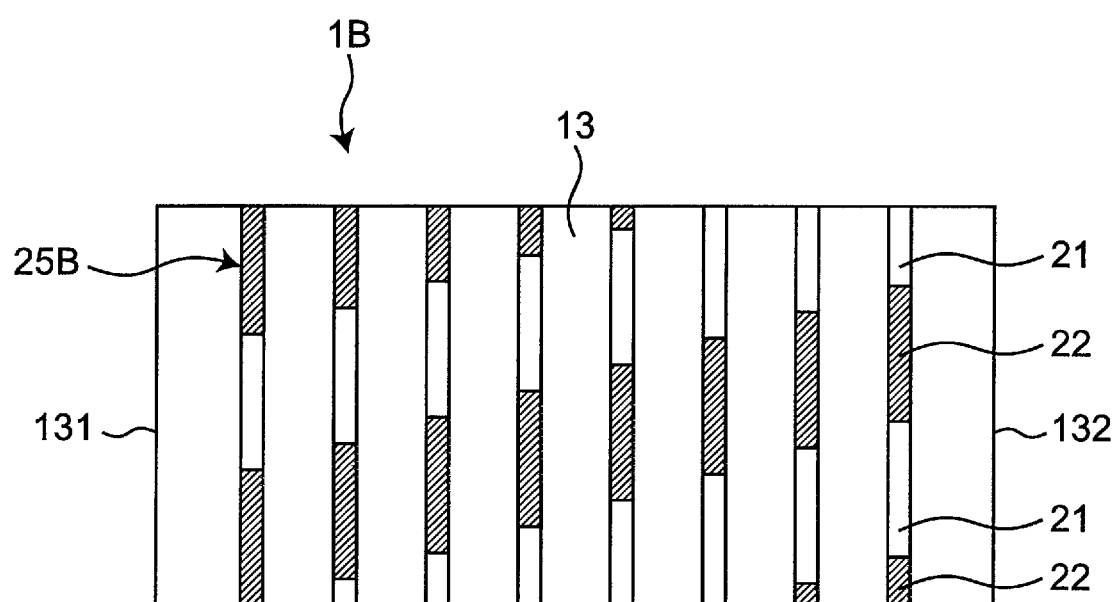
FIG. 10 is a simplified bottom view showing a third embodiment of the coil component.

FIG. 10 is a simplified bottom view showing a third embodiment of the coil component. The third embodiment is different from the first embodiment in the number of twists of the twisted wire portion. This different configuration will hereinafter be described. The other configurations are the same as those of the first embodiment and are denoted by the same reference numerals as the first embodiment and will not be described.

As shown in FIG. 10, in a coil component 1B of the third embodiment, the number of twists per turn of the twisted wire portion 25B is not an integer. As a result, the positional relationship between the first wire 21 and the second wire 22 is not fixed at each turn of the twisted wire portion 25B, and this can further reduce the line capacity of the twisted wire portion 25B and the bias of capacity between the mounting substrate and the wires. For simplicity, FIG. 10 shows the twisted wire portion 25B including white portions in which the first wire 21 is located outside the second wire 22 and hatched portions in which the second wire 22 is located outside the first wire 21.

The number of twists per turn of the twisted wire portion 25B is more preferably n1/n2 (n2 is a prime number). As a result, a larger number of turns is required for the positional relationship between the first wire 21 and the second wire 23 at each turn of the twisted wire portion 25B to return to the same relationship, and this can further reduce the line capacity of the twisted wire portion 25B and the bias of capacity between the mounting substrate and the wires.

EXAMPLES

For examples and comparative examples of the coil component of the present disclosure, simulation results of line capacity generated in a bank region will hereinafter be described. FIGS. 11A, 11B, 11C, 12A, and 12B are views showing configurations of bank regions in which the line capacity is simulated.

Figure 11A:
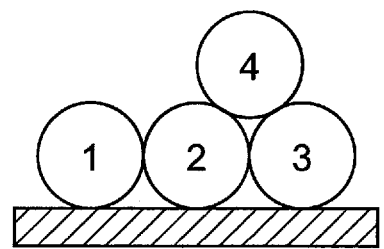
FIG. 11A is a simplified cross-sectional view showing a bank region of Example 1.
Figure 11B:
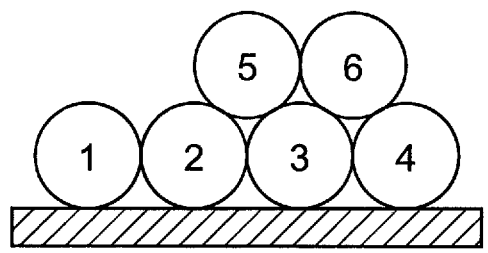
FIG. 11B is a simplified cross-sectional view showing a bank region of Example 2.
Figure 11C:
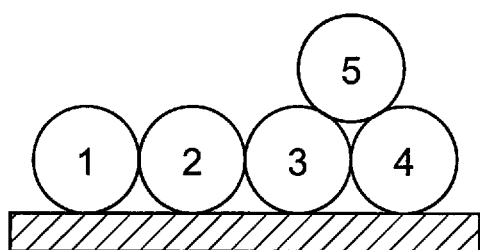
FIG. 11C is a simplified cross-sectional view showing a bank region of Example 3.

Specifically, in the bank region of Example 1, as shown in FIG. 11A, the first layer is made up of three turns from the first turn to the third turn continuously wound around the winding core part, and the second layer is made up of one turn that is the fourth turn wound on the second turn and the third turn. In the bank region of Example 2, as shown in FIG. 11B, the first layer is made up of four turns from the first turn to the fourth turn continuously wound around the winding core part, and the second layer is made up of two turns that are the fifth turn wound on the second turn and the third turn and the sixth turn wound on the third turn and the fourth turn. In the bank region of Example 3, as shown in FIG. 11C, the first layer is made up of four turns from the first turn to the fourth turn continuously wound around the winding core part, and the second layer is made up of one turn that is the fifth turn wound on the third turn and the fourth turn.

Figure 12A:
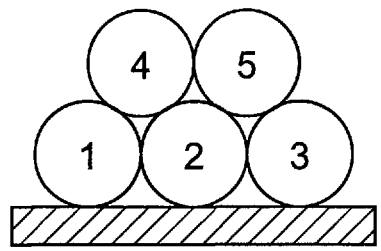
FIG. 12A is a simplified cross-sectional view showing a bank region of Comparative Example 1.
Figure 12B:
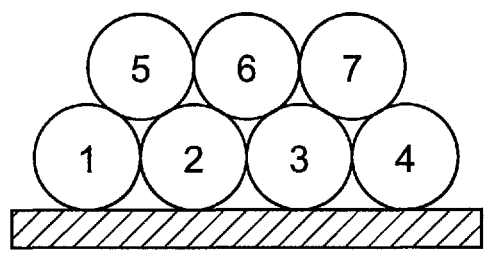
FIG. 12B is a simplified cross-sectional view showing a bank region of Comparative Example 2.

In the bank region of Comparative Example 1, as shown in FIG. 12A, the first layer is made up of three turns from the first turn to the third turn continuously wound around the winding core part, and the second layer is made up of two turns that are the fourth turn wound on the first turn and the second turn and the fifth turn wound on the second turn and the third turn. In the bank region of Comparative Example 2, as shown in FIG. 12B, the first layer is made up of four turns from the first turn to the fourth turn continuously wound around the winding core part, and the second layer is made up of three turns that are the fifth turn wound on the first turn and the second turn, the sixth turn wound on the second turn and the third turn, and the seventh turn wound on the third turn and the fourth turn.

As described above, in the bank regions of Examples 1 to 3, the number of turns of the second layer is reduced by two turns or more as compared to the number of turns of the first layer, and in the bank regions of Comparative Examples 1 and 2, the number of turns of the layer is reduced by only one turn as compared to the number of turns of the first layer. For each of Examples 1 to 3 and Comparative Examples 1 and 2, the line capacity generated between the first layer and the second layer was obtained by simulation. Table 1 shows the simulation results.

TABLE 1

| | Example 1 | Example 2 | Example 3 | Comparative Example 1 | Comparative Example 2 |
|---|---|---|---|---|---|
| first layer | 3T | 4T | 4T | 3T | 4T |
| second layer | 1T | 2T | 1T | 2T | 3T |
| capacity generated between first and second layers | 0.6 pF | 0.68 pF | 0.6 pF | 0.68 pF | 1.02 pF |

As can be seen from Table 1, in the case of the first layer having three turns, Example 1 was able to reduce the line capacity by 0.08 pF (about 12%) relative to the comparative example 1, and in the case of the first layer having four turns, Examples 2 and 3 were able to reduce the line capacity by 0.34 (about 33%) and 0.42 (about 41%), respectively, relative to the comparative example 2.

(Modifications)

The present disclosure is not limited to the embodiments described above and can be changed in design without departing from the spirit of the present disclosure. For example, the respective characteristic points of the first to third embodiments may variously be combined.

Although the coil component is used as a common mode choke coil in the embodiments, the coil component may be used as a winding type coil having a plurality of wires wound around a winding core part, such as a transformer and a coupled inductor array, for example. Even in these winding type coils, a reduction of line capacity is useful.

Although the plate member is disposed in the embodiments, the plate member may not be included. Although the coil includes two wires in the embodiments, the coil may include a plurality of wires, and three or more wires may be included. In this case, the twisted wire portion is not limited to a configuration in which two wires are twisted together and may have a configuration in which three or more wires are twisted together.

Although the twisted wire portion is wound in two layers to form the bank regions in the embodiments, the twisted wire portion may be wound in three or more layers to form the bank regions. In this case, at least in the relation between the first layer directly wound on the winding core part and the second layer wound on the first layer, the second layer may sparsely be wound with the number of turns reduced by two or more as compared to the number of turns of the first layer, and the configuration of the third and subsequent layers is not limited. However, also for the third and subsequent layers, an upper layer is preferably sparsely wound with the number of turns reduced by two or more as compared to the number of turns of a lower layer immediately under the upper layer, and the number of turns of the uppermost layer is preferably one.

In the embodiments, the first to fifth bank regions B1 to B5 are disposed, including four regions, i.e., the first to fourth bank regions B1 to B4, sparsely wound with the number of turns of the second layer reduced by two or more as compared to the number of turns of the first layer; however, the present disclosure is not limited to this configuration. The twisted wire portion may have at least one sparsely-wound bank region and, for example, the number of the sparsely-wound bank regions may be one or more and three or less, or five or more. The number of closely-wound bank regions is not limited, and all the bank regions may be sparsely wound, or the number of closely-wound bank regions may be two or more. The positional relationship between the sparsely-wound bank regions and the closely-wound bank regions is not particularly limited, and the closely-wound bank regions may be located at positions sandwiching the sparsely-wound bank region, or the closely-wound bank region may be located at a position sandwiched by the sparsely-wound bank regions. A configuration other than the bank regions may be included and, for example, the coil component may include a single-layer winding region in which a twisted wire portion is not wound on the first layer, or a region in which the twisted wire portion is wound alternately in the first layer and the second layer. Additionally, these regions may be spaced or not spaced from each other and, for example, the first or last turn of the first layer of the bank region may be located adjacently to any of a bank region, a single-layer winding region, and a region in which the twisted wire portion is wound alternately in the first layer and the second layer.

In the embodiments, the sparsely-wound bank regions are the first bank region B1 having four turns for the first layer and one turn for the second layer and the second to fourth bank regions B2 to B4 having four turns for the first layer and two turns for the second layer; however, the sparsely-wound bank regions are not limited thereto. Specifically, for example, the sparsely-wound bank region may have three turns for the first layer and one turn for the second layer, or the sparsely-wound bank region may have five or more turns for the first layer. The shape of the sparsely-wound bank region is not limited to the shape in which the second layer is shifted toward the final turn of the first layer and may be a shape in which the second layer is shifted to the opposite side or a shape in which the second layer is centered. If the twisted wire portion has a closely-wound bank region, the closely-wound bank region is not particularly limited as described above and may have two turns or four or more turns for the first layer.

In the embodiments, the inner surface of the first flange part and the inner surface of the second flange part are orthogonal to the extending direction of the winding core part; however, the inner surface of the first flange part and the inner surface of the second flange part may have inclined portions parallel to each other and obliquely intersecting with the extending direction of the winding core part. As a result, when the wires are wound around the winding core part, the wires can be led out along the inclined portion to the first to fourth electrode parts, which can achieve a reduction of a portion not contributing to the winding of the winding core part and an increase in areas of connection of the first and second flange parts to the plate member.

In the embodiments, the coil has a twisted wire portion in which a plurality of wires is twisted together, the twisted wire portion has a bank region including a first layer wound multiple turns continuously around a winding core part and a second layer wound on the first layer continuously from the first layer, and the bank region is sparsely wound with the number of turns of the second layer reduced by two or more as compared to the number of turns of the first layer; however, the present disclosure is not limited thereto. For example, the bank region may not sparsely be wound, i.e., may have a closely-wound configuration in which the number of turns of the second layer is reduced by one as compared to the number of turns of the first layer. The coil may have a configuration without a bank region or a twisted wire portion.

In the embodiments, the electrode part has a lower-surface-side base electrode disposed on the lower surface and an outer-surface-side base electrode disposed on the outer surface, and the outer-surface-side base electrode has a shape extending from on an end portion of the lower-surface-side base electrode on the outer surface side onto the outer surface; however, the present disclosure is not limited thereto. For example, the electrode part may have only the lower-surface side base electrode without the outer-surface side base electrode.

The invention claimed is:

1. A manufacturing method of a coil component, comprising:
    forming a twisted wire portion-including a plurality of first twisted sections in which a plurality of wires are twisted together in a first twisting direction, at least one second twisted section in which the plurality of wires are twisted together in a second twisting direction opposite to the first twisting direction, and a plurality of inverted portions in which the twisting direction changes between the first twisting direction and the second twisting direction; and
    winding the twisted wire portion around a winding core part of a core to manufacture the coil component,
    wherein the twisted wire portion wound around the winding core part has an even number of inverted portions.

2. The manufacturing method of a coil component according to claim 1, wherein
    at the forming the first twisted section, a winding nozzle holding the plurality of wires is revolved around the winding core part in a first direction without being rotated around its own axis, and
    at the forming the second twisted section, the winding nozzle is revolved around the winding core part in a direction opposite to the first direction without being rotated around its own axis.

3. A manufacturing method of a taping reel, comprising:
    manufacturing the coil component according to claim 1;
    preparing a tape including a plurality of pockets arranged along a longitudinal direction; and
    storing the coil component in one of the pockets.

4. A manufacturing method of a taping reel, comprising:
    manufacturing the coil component according to claim 2;
    preparing a tape including a plurality of pockets arranged along a longitudinal direction; and
    storing the coil component in one of the pockets.

* * * * *